United States Patent
Riho et al.

(10) Patent No.: US 11,335,393 B2
(45) Date of Patent: *May 17, 2022

(54) SEMICONDUCTOR DEVICE PERFORMING REFRESH OPERATION IN DEEP SLEEP MODE

(71) Applicant: MICRON TECHNOLOGY, INC., Boise, ID (US)

(72) Inventors: Yoshiro Riho, Koganei (JP); Yoshinori Matsui, Sagamihara (JP); Kiyohiro Furutani, Nishinomiya (JP); Takahiko Fukiage, Akashi (JP); Ki-Jun Nam, Boise, ID (US); John D. Porter, Boise, ID (US)

(73) Assignee: Micron Technology, Inc., Boise, ID (US)

(*) Notice: Subject to any disclaimer, the term of this patent is extended or adjusted under 35 U.S.C. 154(b) by 24 days.

This patent is subject to a terminal disclaimer.

(21) Appl. No.: 17/173,048

(22) Filed: Feb. 10, 2021

(65) Prior Publication Data
US 2021/0166753 A1  Jun. 3, 2021

Related U.S. Application Data

(63) Continuation of application No. 16/163,422, filed on Oct. 17, 2018, now Pat. No. 10,923,171.

(51) Int. Cl.
*G11C 11/406* (2006.01)
*G11C 11/4076* (2006.01)
*G11C 11/408* (2006.01)

(52) U.S. Cl.
CPC .... *G11C 11/40615* (2013.01); *G11C 11/4076* (2013.01); *G11C 11/4085* (2013.01)

(58) Field of Classification Search
CPC .......... G11C 11/40615; G11C 11/4085; G11C 11/4076; G11C 11/406; G11C 11/40611; G11C 11/4074; G11C 11/408
See application file for complete search history.

(56) References Cited

U.S. PATENT DOCUMENTS

| | | |
|---|---|---|
| 5,262,998 A | 11/1993 | Mnich et al. |
| 5,544,120 A | 8/1996 | Kuwagata et al. |
| 5,566,117 A | 10/1996 | Okamura et al. |
| 7,383,149 B1 | 6/2008 | Walker |
| 10,923,171 B2* | 2/2021 | Riho ................ G11C 11/40615 |
| 2006/0120193 A1 | 6/2006 | Casper |
| 2007/0001752 A1* | 1/2007 | Jin ........................ G05F 1/465 |
| | | 327/541 |

(Continued)

OTHER PUBLICATIONS

International Search Report & Written Opinion for PCT Application No. PCT/US2019/056132 dated Feb. 4, 2020, 11 pgs.

*Primary Examiner* — Jay W. Radke
(74) *Attorney, Agent, or Firm* — Dorsey & Whitney LLP (57) ABSTRACT

Disclosed herein is an apparatus that includes a memory cell array including a plurality of memory cells, a first counter circuit configured to periodically update a count value during a first operation mode, a burst clock generator configured to successively generate a burst pulse predetermined times when the count value indicates a predetermined value, and a row address control circuit configured to perform a refresh operation on the memory cell array in response to the burst pulse.

20 Claims, 9 Drawing Sheets

(56) References Cited

U.S. PATENT DOCUMENTS

2007/0171750 A1 7/2007 Oh
2010/0157714 A1 6/2010 Oh
2010/0208537 A1 8/2010 Pelley, III et al.
2018/0240511 A1 8/2018 Yoshida et al.

\* cited by examiner

| | Required power for data retention | Required power for Refresh | Power during deep sleep | Remark |
|---|---|---|---|---|
| VCCP | | Yes | Change detect level to 2.5V | |
| VNWL | Yes | Yes | Keep at target level | |
| VBB | Yes | Yes | Keep at target level | |
| VDRV | | Yes | Stopped | Clamp VDD1 |
| VEQ | | Yes | Stopped | Clamp VDD2 |
| VGIDL | | Yes | Stopped | Clamp VDD1 |
| VPLT | Yes | Yes | Keep at target level | |
| VBLP | Yes | Yes | Keep at target level | |
| VYSPP | | | Stopped | Clamp VDD2 |
| VARY | | Yes | Keep at target level | |
| VDLP | | Yes | Stopped | Clamp VDD2 |
| VYS | | | Stopped | Clamp VDD2 |
| VNSG | Yes | Yes | Keep at target level | |

SEMICONDUCTOR DEVICE PERFORMING REFRESH OPERATION IN DEEP SLEEP MODE

CROSS-REFERENCE TO RELATED APPLICATION

This application is a continuation of U.S. patent application Ser. No. 16/163,422, filed Oct. 17, 2018 and issued as U.S. Pat. No. 10,923,171 on Feb. 16, 2021. This application and patent are incorporated by reference herein in their entirety and for all purposes.

BACKGROUND

When a DRAM is being operated in a self-refresh mode, a refresh operation is automatically performed in response to a periodically generated oscillator signal. With this operation, volatile data held in a memory cell array is restored. In the self-refresh mode, because many internal circuits included in the DRAM are inactivated, the consumption current of the DRAM is small. However, in the self-refresh mode, because a periodic refresh operation is performed, circuits required for refresh operations are maintained in an activated state.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
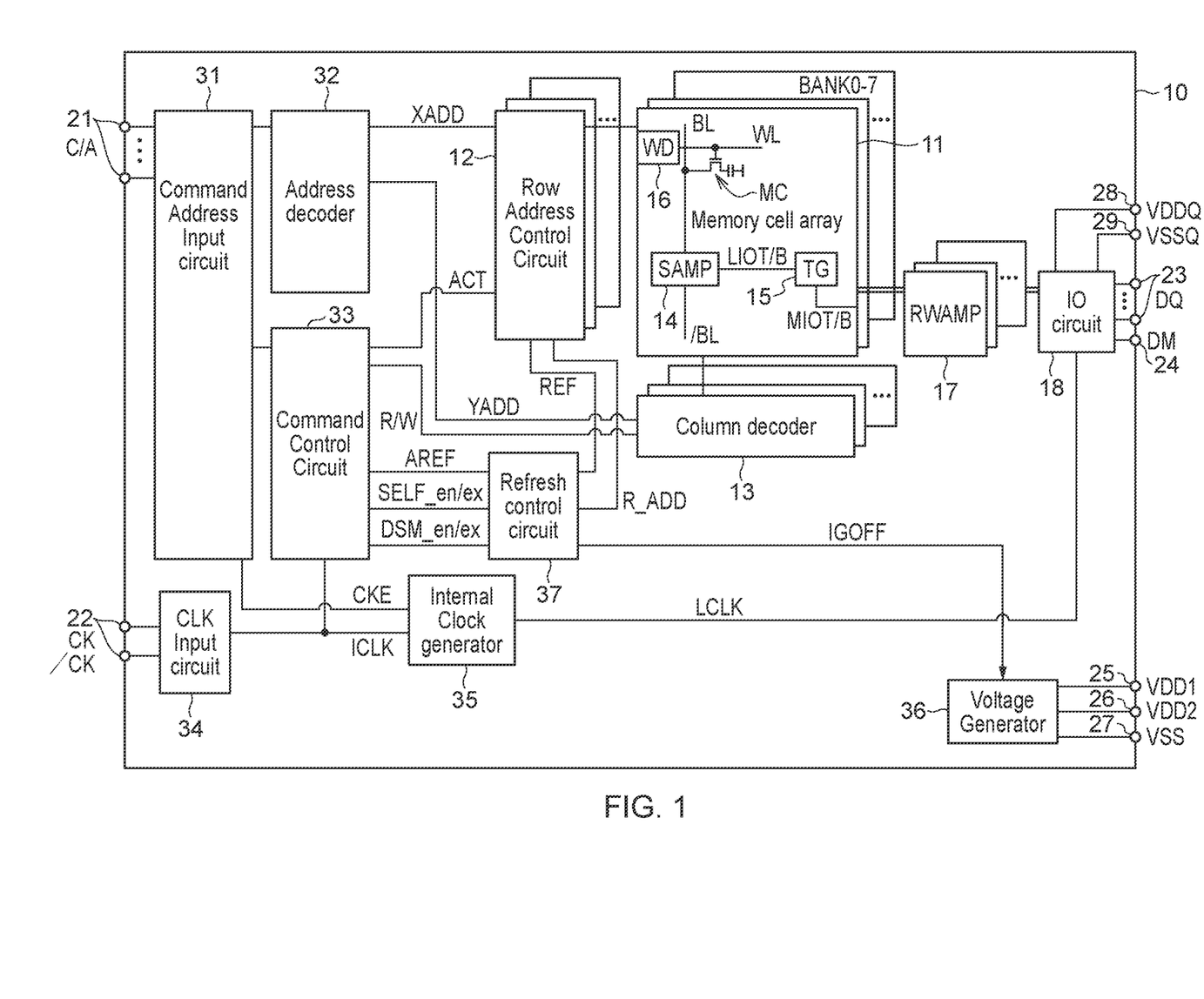
FIG. 1 is a block diagram of a semiconductor device according to an embodiment of the present disclosure.

FIG. 1 is a block diagram of a semiconductor device according to an embodiment of the present disclosure. For example, a semiconductor device 10 can be an LPDDR4 SDRAM incorporated in a single semiconductor chip. The semiconductor device 10 may be implemented on an external substrate such as a memory module substrate or a motherboard. As shown in FIG. 1, the semiconductor device 10 includes memory cell arrays 11. Each of the memory cell arrays 11 includes a plurality of word lines WL, a plurality of bit lines BL, and a plurality of memory cells MC provided at intersections of the word lines WL and the bit lines BL. Selection of the word lines WL is made by row address control circuits 12, and selection of the bit lines BL is made by column decoders 13. A sense amplifier 14 is connected to a corresponding bit line BL and a local I/O line pair LIOT/B. The local I/O line pair LIOT/B is connected to a main I/O line pair MIOT/B via a transfer gate 15 that functions as a switch. The word lines WL are activated by a word driver 16.

A plurality of external terminals included in the semiconductor device 10 respectively include command address terminals 21, clock terminals 22, data terminals 23, a data mask terminal 24, and power supply terminals 25 to 29. The data terminals 23 are connected to an I/O circuit 18.

Command address signals CA are supplied to the command address terminals 21. Among the command address signals CA supplied to the command address terminals 21, signals related to addresses are transferred to an address decoder 32 via a command address input circuit 31, and signals related to commands are transferred to a command control circuit 33 via a command address input circuit 31. The address decoder 32 decodes address signals to generate a row address XADD and a column address YADD. The row address XADD is supplied to the row address control circuit 12, and the column address YADD is supplied to the column decoder 13. Among the command address signals CA, a clock enable signal CKE is supplied to an internal clock generator 35.

When an active command is issued, the command control circuit 33 activates an active signal ACT, and when a read command or a write command is issued, the command control circuit 33 activates a read/write signal R/W. When a read command is issued after an active command is issued, read data is read from the memory cell array 11. The read data read from the memory cell array 11 is transferred to the I/O circuit 18 via a read amplifier 17, and is output to outside from the data terminal 23.

Complementary external clock signals CK and /CK are supplied to the clock terminal 22. The complementary external clock signals CK and /CK are input to a clock input circuit 34. The clock input circuit 34 generates an internal clock signal ICLK based on the complementary external clock signals CK and /CK. The internal clock signal ICLK is supplied at least to the command control circuit 33 and the internal clock generator 35. The internal clock generator 35 is activated by, for example, the clock enable signal CKE, and generates an internal clock signal LCLK based on the internal clock signal ICLK. The internal clock signal MK is supplied to the I/O circuit 18. When a read operation is performed, the internal clock signal LCLK is used as a timing signal for defining a timing when read data DQ is output from the data terminal 23. When a write operation is performed, write data is input from outside to the data terminal 23. When a write operation is performed, it is permissible that a data mask signal DM is input from outside to the data ask terminal 24.

Power potentials VDD1, VDD2, and VSS are supplied to power supply terminals 25 to 27, respectively. These power potentials VDD1, VDD2, and VSS are supplied to a voltage generator 36. The voltage generator 36 generates various types of internal potentials described later based on the power potentials VDD1, VDD2, and VSS.

Power potentials VDDQ and VSSQ are supplied from power supply terminals 28 and 29, respectively, to the I/O circuit 18. Dedicated power potentials VDDQ and VSSQ are allocated to the I/O circuit 18 in order not to cause power supply noise generated by the I/O circuit 18 to propagate to other circuit blocks.

The semiconductor device 10 also includes a refresh control circuit 37. An auto-refresh signal AREF, a self-refresh entry signal SELF_en, a self-refresh exit signal SELF_ex, a deep-sleep mode entry signal DSM_en, and a deep-sleep mode exit signal DSM_ex are supplied from the command control circuit 33 to the refresh control circuit 37. When the auto-refresh signal AREF is activated, an auto-refresh operation is performed. When the self-refresh entry signal SELF_en is activated, the semiconductor device 10 enters a self-refresh mode, and when the self-refresh exit signal SELF_ex is activated, the semiconductor device 10 shifts from a self-refresh mode to a normal operation mode. When the deep-sleep mode entry signal DSM_en is activated, the semiconductor device 10 enters a deep sleep mode, and when the deep-sleep mode exit signal DSM_ex is activated, the semiconductor device 10 shifts from a deep sleep mode to a self-refresh mode. The deep sleep mode is an operation mode having consumption power even lower than that in the self-refresh mode. Shifting from the deep sleep mode to the self-refresh mode takes a relatively long time (for example, 200 μs).

When the semiconductor device 10 enters a deep sleep mode, a power control signal IGOFF is periodically activated. When the power control signal IGOFF is activated, the voltage generator 36 stops generating a portion of the internal voltage potentials.

Figure 2:
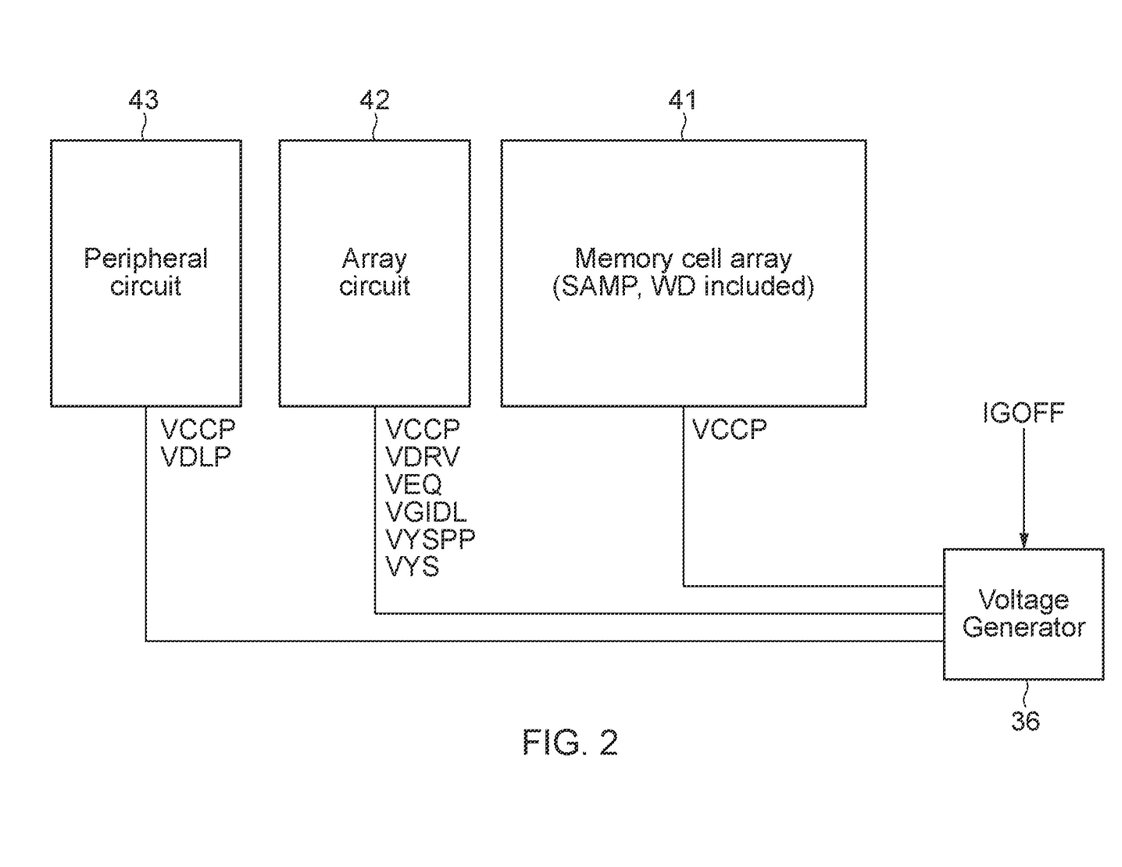
FIG. 2 is an explanatory diagram of internal potentials supplied to a memory cell array, an array circuit, and a peripheral circuit.

As shown in FIG. 2, the circuits included in the semiconductor device 10 can be classified into a memory cell array 41, an array circuit 42, and a peripheral circuit 43. The voltage generator 36 supplies an internal potential VCCP to the memory cell array 41. The internal potential VCCP is a potential required for boosting the word lines WL. The voltage generator 36 supplies internal potentials VCCP, VDRV, VEQ, VGIDL, VYSPP, and VYS to the array circuit 42. The internal potential VDRV is a potential required for inactivating the word lines WL. The internal potential VEQ is a potential required for equalizing the bit lines BL. The internal potential VGIDL is a potential slightly lower than the internal potential VCCP. The internal potential VYSPP is a potential required for generating the internal potential VYS, and the internal potential VYS is a potential required for operating a column switch. The voltage generator 36 supplies the internal potential VCCP and an internal potential VDLP to the peripheral circuit 43. The internal potential VDLP is a potential required for operating a delay circuit.

Figure 3:
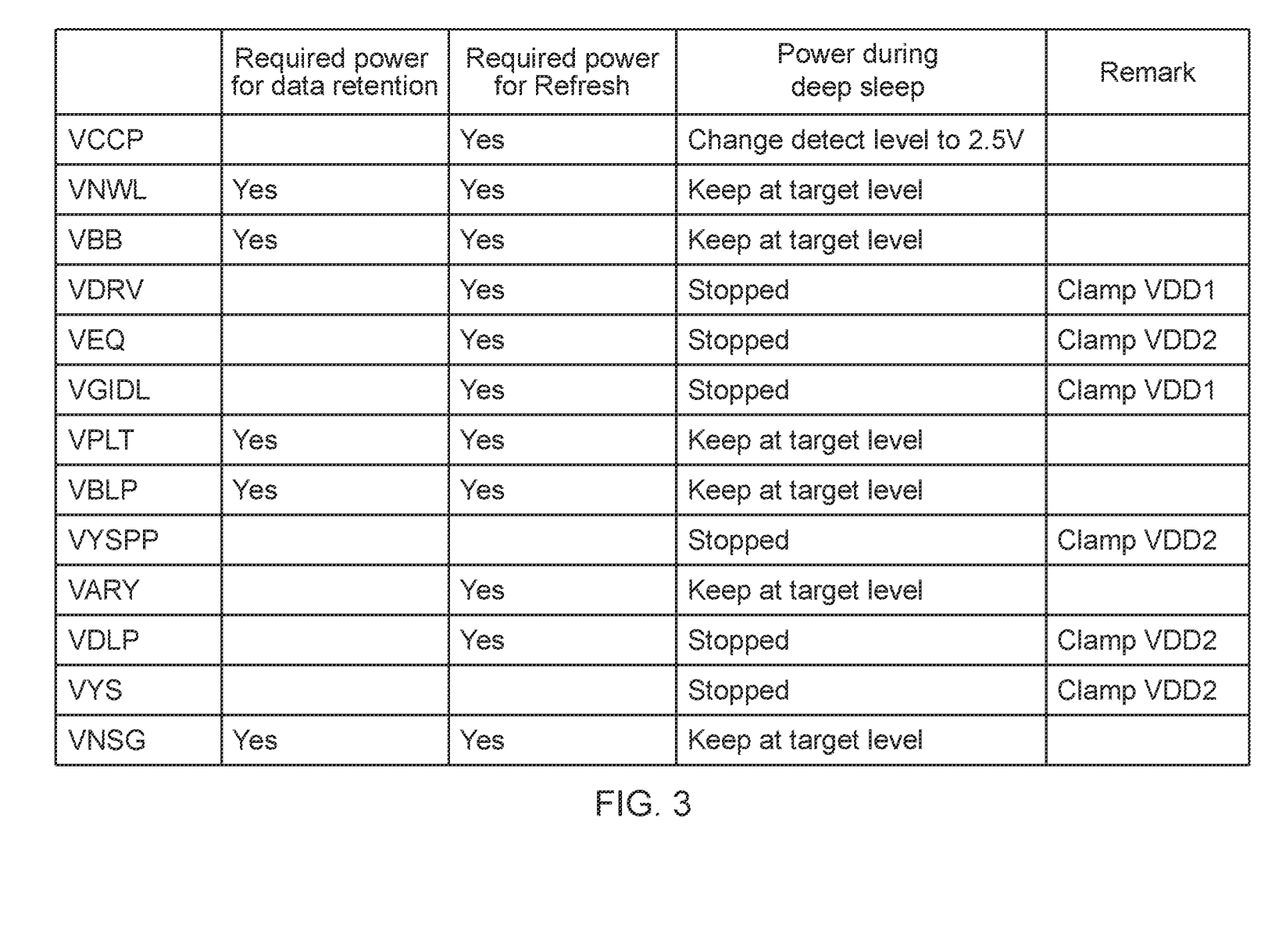
FIG. 3 is a diagram showing whether respective internal potentials are required for data retention, and whether respective internal potentials are required for refresh operations.

FIG. 3 shows whether respective internal potentials are required for data retention, and whether respective internal potentials are required for refresh operations. As shown in FIG. 3, internal potentials VNWL, VPLT, VBLP, and VNSG are internal potentials required for data retention. Further, internal potentials VCCP, VNWL, VBB, VDRV, VEQ, VGIDL, VPLT, VBLP, VARY, VDLP, and VNSG are internal potentials required for refresh operations. When the semiconductor device 10 is in a self-refresh mode, all the internal potentials required for a refresh operation are generated by the voltage generator 36. However, when the semiconductor device 10 enters a deep sleep mode, the voltage generator 36 stops generation of a part of the internal potentials required for a refresh operation or lowers the level thereof. Specifically, when the semiconductor device 10 enters a deep sleep mode, the voltage generator 36 stops generation of the internal potentials VDRV, VEQ, VGIDL, VYSPP, VDLP, and VYS, and lowers the level of the internal potential VCCP from 3.1 volts to 2.5 volts. The internal potentials VDRV and VGIDL are clamped to the external potential VDD1, and the internal potentials VEQ, VYSPP VDLP, and VYS are clamped to the external potential VDD2. Even when the semiconductor device 10 enters a deep sleep mode, generation of other internal potentials VNWL, VBB, VBLP, VBLP, VARY, and VNSG is continued and the target level thereof is maintained.

Figure 4:
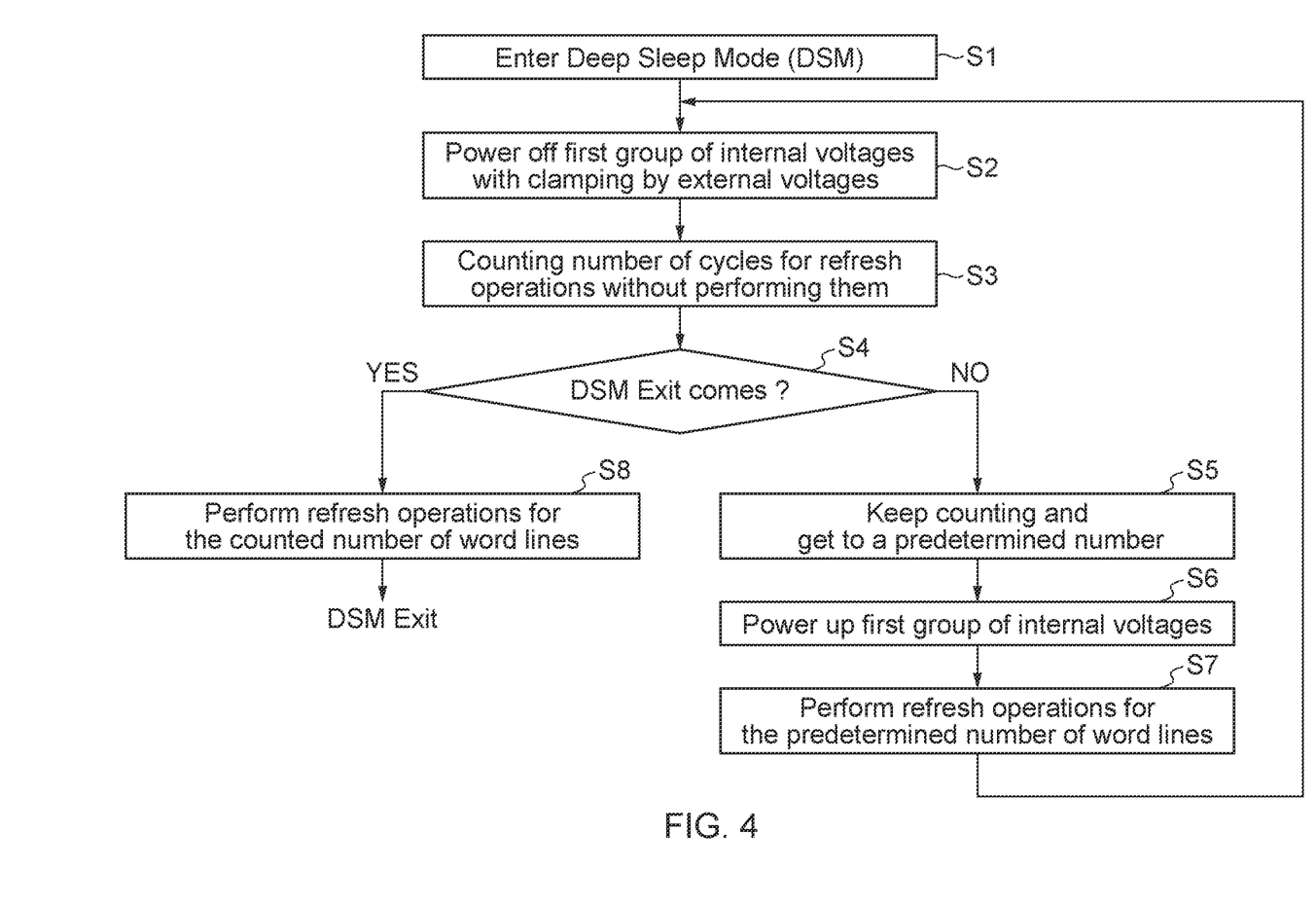
FIG. 4 is a flowchart for explaining an operation when the semiconductor device enters a deep sleep mode.

FIG. 4 is a flowchart for explaining an operation when the semiconductor device 10 enters a deep sleep mode. First, when the semiconductor device 10 enters a deep sleep mode (S1), generation of the predetermined internal potentials described above is stopped, and the level of the internal potentials being generated is stopped and clamped to the external potential VDD1 or VDD2 (S2). Subsequently, without performing any refresh operation, a periodical counting operation is performed (S3). Thereafter, when any deep-sleep mode exit command has not occurred (S4:N) and a count value reaches a predetermined value (S5), the voltage generator 36 is activated and the generation of the internal potentials having been previously clamped to the external potential VDD1 or VDD2 is restarted (S6), and then a refresh operation is performed (S7). The number of refresh operations are performed is determined by a predetermined count value. When the refresh operations are performed for the predetermined number of times, generation of the internal potentials is stopped again, and the level of the internal potentials being generated is again stopped and clamped to the external potential VDD1 or VDD2 (S2). The operations described above are repeated until a deep-sleep mode exit command is issued. When a deep-sleep mode exit command occurs (S4: Y), refresh operations are performed for a number of times equal to the current count value (S8), and then the deep sleep mode is finished.

Figure 5:
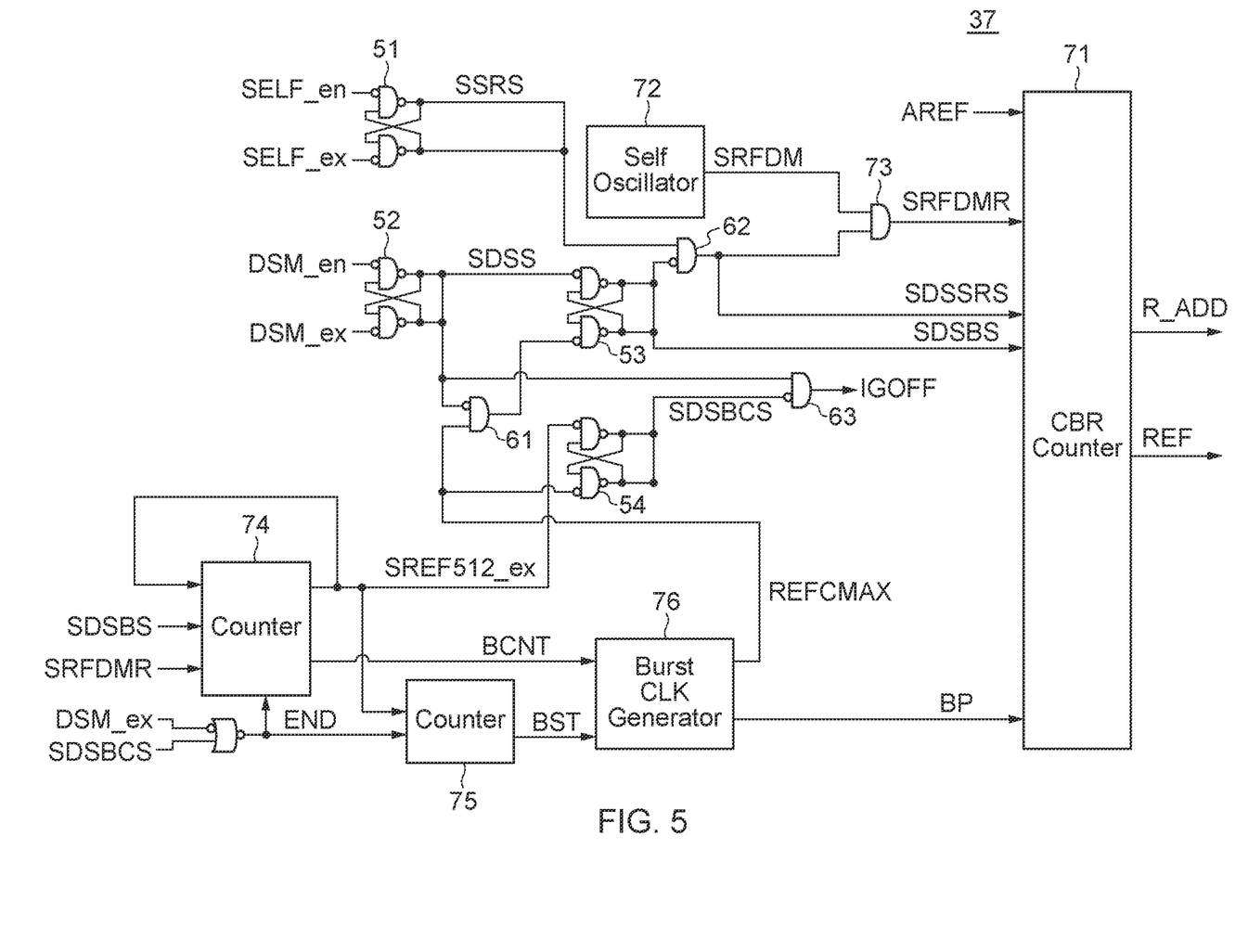
FIG. 5 is a circuit diagram showing a configuration of a refresh control circuit.

As shown in FIG. 5, the refresh control circuit 37 includes an RS latch circuit 51 that generates a self-refresh mode state signal SSRS upon reception of the self-refresh entry signal SELF_en and the self-refresh exit signal SELF_ex, and an RS latch circuit 52 that generates a deep-sleep mode state signal SDSS upon reception of the deep-sleep mode entry signal DSM_en and the deep-sleep mode exit signal DSM_ex. The self-refresh mode state signal SSRS is activated at a high level during a period where the semiconductor device 10 is in a self-refresh mode. The deep-sleep mode state signal SDSS is activated at a high level during a period where the semiconductor device 10 is in a deep sleep mode.

The deep-sleep mode state signal SDSS is input to one of input nodes of the RS latch circuit 53. An output signal of an AND gate circuit 61 is input to the other one of the input nodes of the RS latch circuit 53. A deep-sleep mode selection signal SDSBS output from the RS latch circuit 53 is input to a refresh counter 71. During a period where the deep-sleep mode selection signal SDSBS is activated at a high level, the refresh counter 71 responds to a burst pulse signal BP to update a refresh address R_ADD, and activates a refresh signal REF. The refresh address R_ADD and the refresh signal REF are supplied to the row address control circuit 12 shown in FIG. 1. When the refresh signal REF is activated, the row address control circuit 12 selects a word line WL indicated by the refresh address R_ADD and refreshes a memory cell MC connected to the selected word line WL.

The self-refresh mode state signal SSRS and the deep-sleep mode selection signal SDSBS are input to an AND gate circuit 62. A self-refresh mode selection signal SDSSRS output from the AND gate circuit 62 is input to the refresh counter 71. During a period where the self-refresh mode selection signal SDSSRS is activated at a high level, the refresh counter 71 responds to a self-refresh pulse signal SRFDMR to update the refresh address R_ADD and activates the refresh signal REF. The self-refresh pulse signal SRFDMR is a signal that an oscillator signal SRFDM periodically activated by an oscillator circuit 72 has passed an AND circuit 73. During a period where the self-refresh mode selection signal SDSSRS is activated, the AND circuit 73 outputs the oscillator signal SRFDM as the self-refresh pulse signal SRFDMR.

When the self-refresh mode selection signal SDSSRS and the deep-sleep mode selection signal SDSBS are both inactivated at a low level, the refresh counter 71 responds to the auto-refresh signal AREF to update the refresh address R_ADD and activates the refresh signal REF.

The refresh control circuit 37 further includes counter circuits 74 and 75 and a burst clock generator 76. The counter circuit 74 is activated by the deep-sleep mode selection signal SDSBS and counts the self-refresh pulse signal SRFDMR. In the present embodiment, the maximum count value of the counter circuit 74 is 512, and when the count value of the counter circuit 74 reaches the maximum value, a pulse signal SREF512_ex is activated. The pulse signal SREF512_ex is fed back to the counter circuit 74. When the pulse signal SREF512_ex is activated, the count value of the counter circuit 74 is reset to 0 (zero).

The pulse signal SREF512_ex is supplied to the counter circuit 75. When a predetermined time has elapsed after the pulse signal SREF512_ex or an end signal END is activated, the counter circuit 75 activates a burst start signal BST. The predetermined time since the pulse signal SREF512_ex or the end signal END is activated until the burst start signal BST is activated is, for example, 100 μs. This predetermined time is set based on a time required for the voltage generator 36 to cause an internal potential to return to a predetermined level. That is, in state where the voltage generator 36 has stopped generating a predetermined internal potential, the voltage generator 36 restarts the generation of the predetermined internal potential. In this case, if the time required for the predetermined internal potential to return to a predetermined level is 100 μs, it suffices that the predetermined time defined by the counter circuit 75 is 100 μs.

The burst start signal BST is input to the burst clock generator 76. The burst clock generator 76 responds to the burst start signal BST. After the burst start signal BST is asserted, the count value BCNT of the counter circuit 74 then continuously pulses the burst pulse signal BP repeatedly a number of times that is equal to the count value BCNT. In this case, when the burst start signal BST is a signal responding to the pulse signal SREF512_ex, the value of the count value BCNT to be taken in the burst clock generator 76 is the maximum value of the counter circuit 74, that is, 512. On the other hand, when the burst start signal BST is a signal responding to the end signal END, the value of the count value BCNT to be taken in the burst clock generator 76 is the count value of the counter circuit 74 at a time point where the deep-sleep mode exit signal DSM_ex is activated. When output of the burst pulse signal BP is completed, the burst clock generator 76 activates a burst end signal REFCMAX.

The burst end signal REFCMAX and the deep-sleep mode state signal SDSS are input to the AND gate circuit 61.

Accordingly, after the deep-sleep mode state signal SDSS is inactivated, the activation period of the deep-sleep mode selection signal SDSBS output from the RS latch circuit 53 is extended to a time point where the burst end signal REFCMAX is activated.

The burst end signal REFCMAX and the pulse signal SREF512_ex are input to the RS latch circuit 54. Accordingly, a control signal SDSBCS output from the RS latch circuit 54 becomes a high level during a period since the pulse signal SREF512_ex is activated until the burst end signal REFCMAX is activated. The control signal SDSBCS and the deep-sleep mode state signal SDSS are input to an AND gate circuit 63. Accordingly, except for a period since the pulse signal SREF512_ex is activated until the burst end signal REFCMAX is activated, the power control signal IGOFF output from the AND gate circuit 63 is always at a high level during a period where the deep-sleep mode state signal SDSS is activated at a high level. When the power control signal IGOFF is activated at a high level, a part of the voltage generator 36 shown in FIG. 1 is inactivated and the generation of a predetermined internal potential is stopped.

Figure 6:
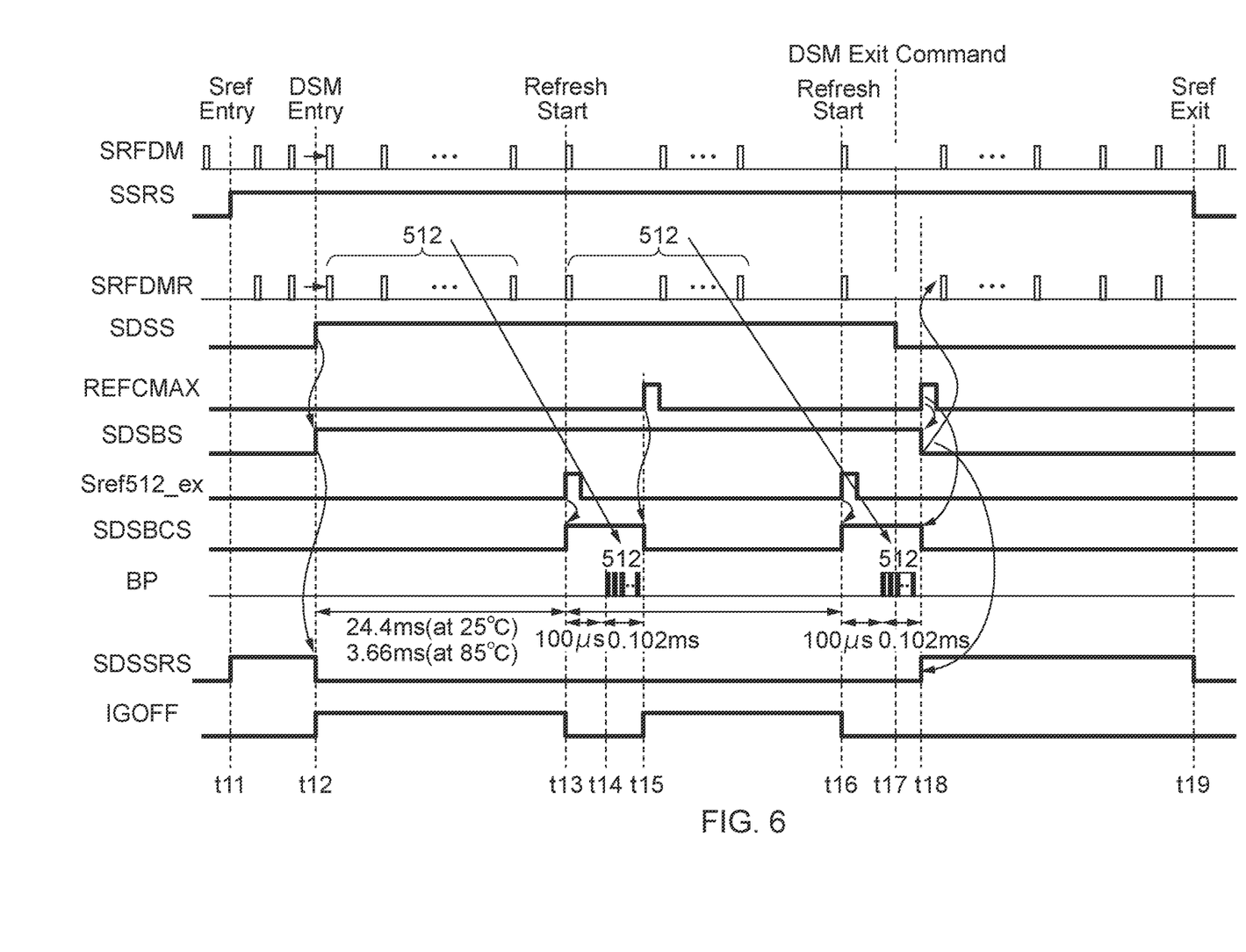
FIGS. 6 and 7 are liming charts for explaining operations of a refresh control circuit.
Figure 7:
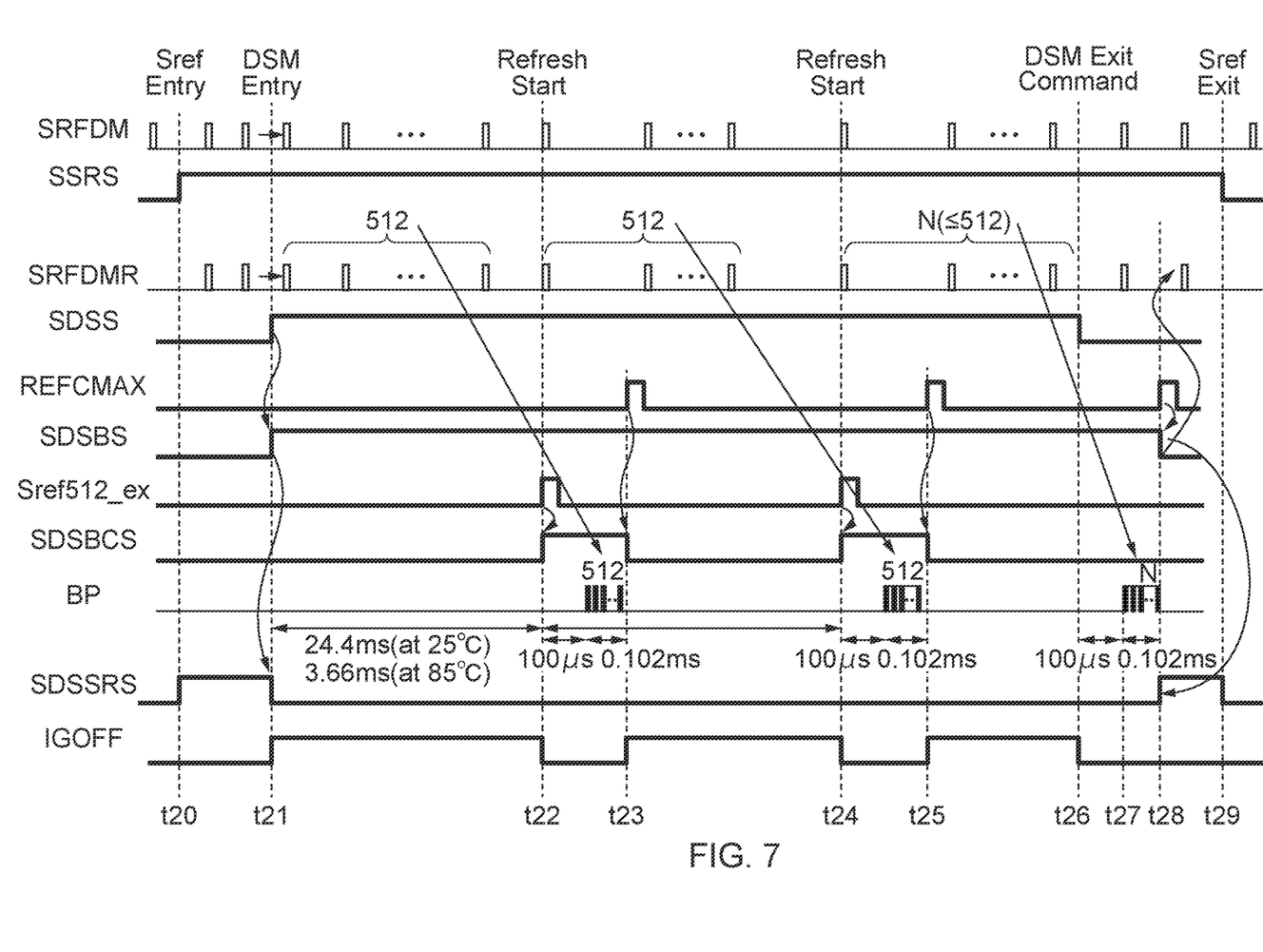

FIGS. 6 and 7 are timing charts for explaining operations of the refresh control circuit 37. FIG. 6 shows an operation in a case where, in a deep sleep mode, an exit command of the deep sleep mode is issued when a refresh operation is being performed, and FIG. 7 shows an operation in a case where, in a deep sleep mode, an exit command of the deep sleep mode is issued during a period where any refresh operation is not performed.

In the example shown in FIG. 6, the semiconductor device 10 enters a self-refresh mode at a time t11 and exits the self-refresh mode at a time t19. Further, the semiconductor device 10 enters a deep sleep mode at a time t12 and exits the deep sleep mode at a time t18. Therefore, the semiconductor device 10 is operated in a self-refresh mode during a period from the time t11 to the time t12 and a period from the time t18 to the time t19, and is operated in a deep sleep mode during a period from the time t12 to the time t18.

First, when an entry command of a self-refresh mode is issued at the time t11, the self-refresh mode state signal SSRS and the self-refresh mode selection signal SDSSRS are shifted to a high level. Accordingly, the refresh counter 71 responds to the self-refresh pulse signal SRFDMR to update the refresh address R_ADD and activates the refresh signal REF. That is, a normal self-refresh operation is performed.

Next, when an entry command of a deep sleep mode is issued at the time t12, the deep-sleep mode state signal SDSS and the deep-sleep mode selection signal SDSBS are shifted to a high level, and the self-refresh mode selection signal SDSSRS is shifted to a low level. Accordingly, the refresh counter 71 responds to the burst pulse signal BP to update the refresh address R_ADD and activates the refresh signal REF. That is, a self-refresh operation in a deep sleep mode is performed.

When the semiconductor device 10 enters a deep sleep mode, the power control signal IGOFF is activated at a high level, and generation of a predetermined internal potential by the voltage generator 36 is stopped. Accordingly, the current consumption of the semiconductor device 10 becomes smaller than that when it is in a self-refresh mode. When the semiconductor device 10 enters a deep sleep mode, a counting operation of the self-refresh pulse signal SRFDMR by the counter circuit 74 is started. The generation cycle of the self-refresh pulse signal SRFDMR can be fixed or can be changed according to the environment temperature. When the counting operation by the counter circuit 74 is advanced and the count value reaches the maximum value (=512) at a time t13, the pulse signal SREF512_ex is activated. The period since the counter circuit 74 has started a counting operation until the count value reaches the maximum value (=512) is, for example, 24.4 ms at 25° C., and is, for example, 3.66 ms at 85° C. When the pulse signal SREF512_ex is activated, the control signal SDSBCS is shifted to a high level, and in response thereto, the power control signal IGOFF is shifted to a low level. As a result, a generating operation of a predetermined internal potential by the voltage generator 36 is restarted. A predetermined time (for example, 100 µs) is required for the voltage generator 36 to stabilize the predetermined internal potential level. When the pulse signal SREF512_ex is activated, a counting operation by the counter circuit 75 is started, and after a predetermined time (for example, 100 µs) has elapsed, the burst start signal BST is activated at a time t14. Therefore, at the timing when the burst start signal BST is activated, the level of the internal potential is already stable.

When the burst start signal BST is activated, the output of the burst pulse signal BP by the burst clock generator 76 is started. The number of times the burst pulse signal BP is pulsed is the equal to the number of the count value BCNT of the counter circuit 74, and it is 512 times in this example. The output interval of the burst pulse signal BP is 200 ns, for example. In this case, the time required for the burst clock generator 76 to output the burst pulse signal BP 512 times is approximately 102 µs. Accordingly, in a normal self-refresh mode, a refresh operation performed periodically (for example, in every 47.6 µs) is performed 512 times at once. When output of the burst pulse signal BP is ended at a time t15, the burst end signal REFCMAX is activated, and the power control signal IGOFF is shifted again to a high level. Therefore, the current consumption of the semiconductor device 10 is significantly reduced again. When the semiconductor device 10 is in a deep sleep mode, the operation described above is repeatedly performed. In this manner, when the semiconductor device 10 is in a deep sleep mode, 512 refresh operations are performed intensively and internal potentials required for a refresh operation are generated only in a period where the refresh operation is performed, and during periods when the refresh operation is not performed, the generation of internal potentials required for refresh operations is stopped. Accordingly, as compared to a case where the semiconductor device 10 is in a normal self-refresh mode, the current consumption thereof can be reduced even more.

In the example shown in FIG. 6, the count value of the counter circuit 74 reaches the maximum value (=512) again at a time t16, and in response thereto, an intensive refresh operation is performed. While this refresh operation is completed at the time t18, in the example shown in FIG. 6, at a time, t17 at which the refresh operation is being performed, an exit command of a deep sleep mode is issued. In response thereto, the deep-sleep mode state signal SDSS is immediately shifted to a low level; however, shifting of the level of the deep-sleep mode selection signal SDSBS is put on hold until the time t18 at which the burst end signal REFCMAX is activated. Accordingly, the semiconductor device 10 does not exit the deep sleep mode immediately, and it is shifted to a self-refresh mode upon completion of 512 refresh operations. Thereafter, when an exit command of the self-refresh mode is issued at the time t19, the semiconductor device 10 is shifted from the self-refresh mode to a normal operation mode.

In the example shown in FIG. 7, the semiconductor device 10 enters a self-refresh mode at a time t20 and exits the self-refresh mode at a time t29. Further, the semiconductor device 10 enters a deep sleep mode at a time t21 and exits the deep sleep mode at a time t28. Therefore, the semiconductor device 10 is operated in a self-refresh mode during a period from the time t20 to the time t21 and a period from the time t28 to the time t29, and is operated in a deep sleep mode during a period from the time t21 to the time t28.

The way the semiconductor device 10 entering a self-refresh mode and entering a deep-sleep mode is the same as that described with reference to FIG. 6, and thus redundant descriptions thereof are omitted. In the example shown in FIG. 7, during a period from a time t22 to a time t23 and a period from a time t24 to a time t25, an intensive refresh operation is performed. During a period from the time t21 to the time t22 and a period from the time t23 to the time t24, generation of a predetermined internal potential is stopped, and the consumption current is reduced. At a time t26 at which generation of an internal potential is stopped, an exit command of a deep sleep mode is issued. In response thereto, the end signal END is activated, and a counting operation by the counter circuit 75 is started. Subsequently, after a predetermined time (for example, 100 µs) has elapsed, the burst start signal BST is activated at a time t27.

When the burst start signal BST is activated, output of the burst pulse signal BP by the burst clock generator 76 is started. The number of times the burst pulse signal BP is output is the same as the number of the count value BCNT of the counter circuit 74, and it is N(<512) times in this example. When output of the burst pulse signal BP is ended at the time t28, the burst end signal REFCMAX is activated. In response thereto, the deep-sleep mode selection signal SDSBS is shifted to a low level, and the self-refresh mode selection signal SDSSRS is shifted to a high level. Accordingly, the semiconductor device 10 is shifted from the deep sleep mode to the self-refresh mode. Thereafter, when an exit command of the self-refresh mode is issued at the time t29, the semiconductor device 10 is shifted from the self-refresh mode to a normal operation mode.

In this manner, when an exit command of a deep sleep mode is issued during a period where a generation of a predetermined internal potential is stopped, the semiconductor device 10 exits the deep sleep mode after performing refresh operations for the same number of times as the number of the current count value BCNT of the counter circuit 74. That is, unprocessed refresh operations are performed at once when the semiconductor device 10 exits the deep sleep mode. Accordingly, the semiconductor device 10 can exit the deep sleep mode without leaving any unprocessed refresh operations.

Figure 8:
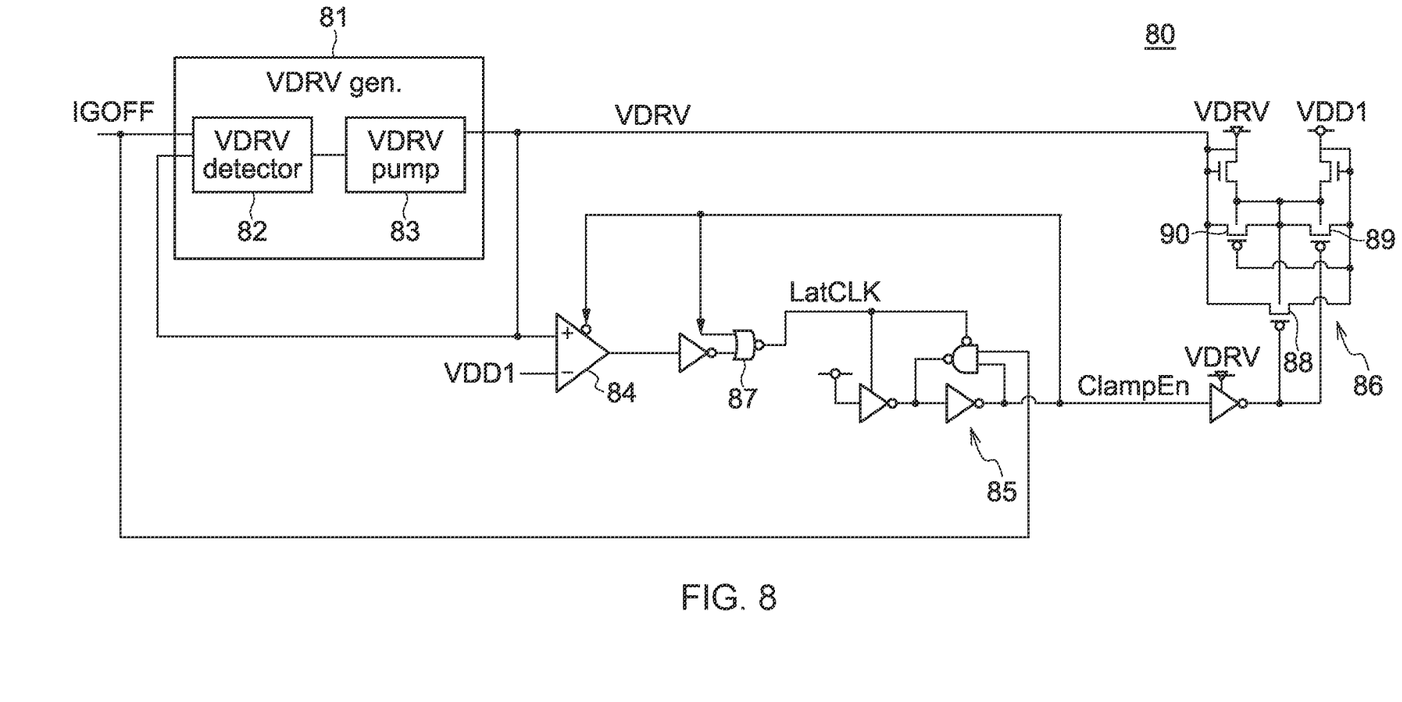
FIG. 8 is a circuit diagram of a circuit that generates an internal potential.
Figure 9:
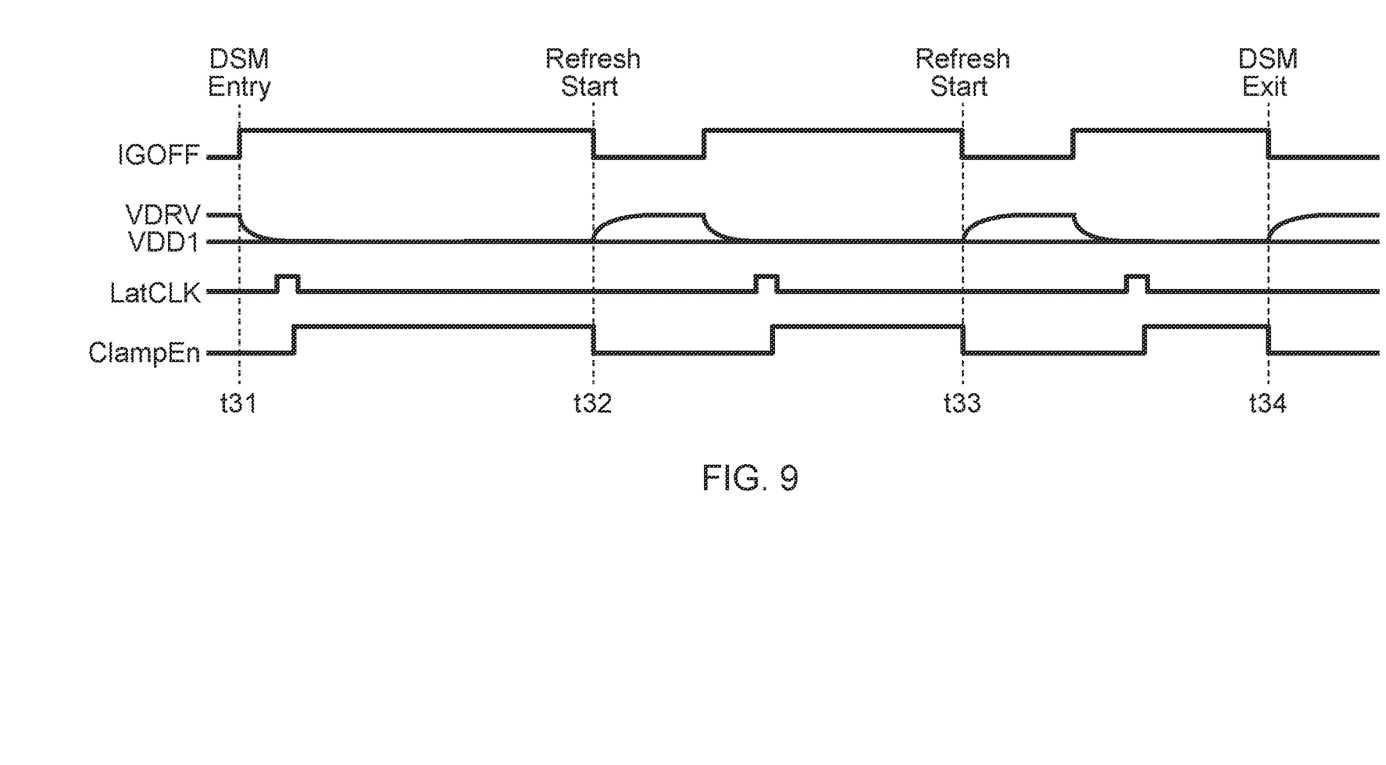
FIG. 9 is a waveform diagram showing a circuit operation of the circuit shown in FIG. 8.

FIG. 8 is a circuit diagram of a circuit 80 that generates the internal potential VDRV. FIG. 9 is a waveform diagram showing a circuit operation of the circuit 80. In the example shown in FIG. 9, the power control signal IGOFF is shifted from a low level to a high level at times t31 and t33, and the power control signal IGOFF is shifted from a high level to a low level at times t32 and t34. The internal potential VDRV is generated by a generator 81. The generator 81 includes a detection circuit 82 that detects the level of the internal potential VDRV and a pump circuit 83 that performs a boosting operation. The generator 81 controls the level of the internal potential VDRV to be a predetermined level. The power control signal IGOFF is input to the generator 81, and a generating operation of the internal potential VDRV is stopped when the power control signal IGOFF becomes a high level at the times t31 and t33. When the generator 81 stops the generating operation of the internal potential VDRV, the level of the internal potential VDRV is lowered. The level of the internal potential VDRV is compared to the external potential VDD1 by a comparator 84, and when the level of the internal potential VDRV becomes lower than that of the external potential VDD1, a latch signal LatCLK is reversed to a high level. When the latch signal LatCLK is reversed to a high level, a clamp signal ClampEn output from a latch circuit 85 becomes a high level. Accordingly, a clamp circuit 86 is activated, and the internal potential VDRV is clamped to the external potential VDD1. When the clamp signal ClampEn becomes a high level, the comparator 84 stops the comparing operation, thereby reducing the consumption current. Further, the clamp signal ClampEn is ted back to an NOR circuit 87. Accordingly when the clamp signal ClampEn becomes a high level, the latch signal LatCLK is fixed at a low level. When the latch signal LatCLK becomes a low level, the latch circuit 85 performs a latch operation, thereby fixing the clamp signal ClampEn to a high level.

When the power control signal MOTT becomes a low level at the times t32 and t34, the generator 81 restarts a generating operation of the internal potential VDRV to be ready for a refresh operation. At the same time, the clamp signal ClampEn output from the latch circuit 85 is set to be a low level. As a result, the comparator 84 and the NOR circuit 87 are activated again and the power control signal IGOFF becomes ready for control that is executed when the power control signal IGOFF is shifted to a high level next time.

The circuit 80 shown in FIG. 8 uses a method of clamping a boosted internal potential VDRV to the external potential VDD1 or VDD2 at the time of inactivating the generator 81. Since an NMOS transistor would serve as a poor switch due to the transistor source terminal elevated to VDD1, the clamp circuit 86 uses a PMOS transistor 88 as a switch. The PMOS transistor 88 connects a VDRV node in a floating state to the external potential VDD1 when the clamp signal ClampEn is at a high level. Because the internal potential VDRV is set to be a higher level than the external potential VDD1, in a normal state, the substrate potential of the PMOS transistor 88 cannot be set as VDD1. Meanwhile, when the substrate potential of the transistor 88 is set as VDRV, if generation of the internal potential VDRV by the generator 81 is stopped, the substrate potential of the transistor 88 becomes a floating state, so that removal of an excessive leakage current cannot be guaranteed. Therefore, by supplying the gate potential of a PMOS transistor 89 connected to the external potential VDD1 and the gate potential of a PMOS transistor 90 connected to the internal potential VDRV from mutually different power supplies, the substrate potential of the transistor 88 is generated. Accordingly, when VDRV>VDD1 is established, the substrate potential of the transistor 88 becomes VDRV, and when VDRV≤VDD1 is established, the substrate potential of the transistor 88 becomes VDD1.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a refresh control circuit configured to generate a refresh address;
   a row address control circuit configured to perform a refresh operation on a memory cell designated by the refresh address using an internal voltage; and
   a voltage generator configured to generate the internal voltage,
   wherein in a self-refresh mode, the refresh control circuit is configured to update the refresh address a predetermined number of times during a first period and configured to cease update of the refresh address during a second period, and
   wherein the voltage generator is configured to cease generation of the internal voltage during the second period.

2. The apparatus of claim 1, wherein the refresh control circuit comprises a refresh counter configured to provide the refresh address.

3. The apparatus of claim 2, wherein the refresh counter is configured to update the refresh address in response to an oscillator pulse.

4. The apparatus of claim 3, further comprising an oscillator circuit configured to periodically activate the oscillator pulse.

5. The apparatus of claim 1, wherein the voltage generator is configured to generate the internal voltage based on an external voltage.

6. The apparatus of claim 1, wherein the voltage generator is configured to clamp the internal voltage to the external voltage during the second period.

7. The apparatus of claim 1, wherein the first and second periods occur while in a first mode of operation, wherein, during a second operation mode, the refresh control circuit is further configured to periodically update the refresh address.

8. The apparatus of claim 7, wherein, during the second operation mode, the refresh operation is performed in response to an oscillator pulse.

9. The apparatus of claim 1, wherein, in the self-refresh mode, the first period repeatedly alternates with the second period.

10. The apparatus of claim 1, further comprising a memory array comprising a plurality of rows of memory cells, wherein the refresh address corresponds to a particular row of the plurality of rows of memory cells.

11. A method comprising:
   entering a self-fresh mode at a memory responsive to a self-refresh entry command, during a first time period while in the self-refresh mode:
      generating an internal voltage;
      updating a refresh row address a predetermined number of times; and
      performing a refresh operation on memory cells designated by each of the updated refresh row addresses; and during a second time period while in the self-refresh mode:
   stopping generation of the internal voltage; and
   stopping update of the refresh address.

12. The method of claim 11, further comprising adjusting a refresh counter to update the refresh address.

13. The method of claim 12, further comprising adjusting the refresh counter in response to an oscillator pulse.

14. The method of claim 13, further comprising providing, via an oscillator circuit, the oscillator pulse.

15. The method of claim 11, further comprising, during the first time period, generating the internal voltage based on an external voltage.

16. The method of claim 15, further comprising clamping the internal voltage to the external voltage during the second period.

17. The method of claim 11, wherein the first and second periods occur while in a first mode of operation, the method further comprising, during a second operation mode:
   periodically updating the refresh row address; and
   performing a refresh operation on memory cells designated by each of the updated refresh row addresses.

18. The method of claim 17, wherein, during the second operation mode, performing the refresh operations on the memory cells in response to oscillator pulses.

19. The method of claim 11, further comprising:
   during a third time period while in the self-refresh mode following the second time period:
      generating the internal voltage;
      updating the refresh row address the predetermined number of times; and
      performing the refresh operation on memory cells designated by each of the updated refresh row addresses; and
   during a fourth time period while in the self-refresh mode following the third time period:
      stopping generation of the internal voltage; and
      stopping update of the refresh address.

20. The method of claim 11, further comprising transitioning to the second time period in response to the refresh address being updated the predetermined number of times during the first time period.

* * * * *